(12) United States Patent
Dikovsky et al.

(10) Patent No.: US 11,090,858 B2
(45) Date of Patent: Aug. 17, 2021

(54) METHOD AND SYSTEM FOR FABRICATING CROSS-LAYER PATTERN

(71) Applicant: Stratasys Ltd., Rehovot (IL)

(72) Inventors: Daniel Dikovsky, Ariel (IL); Ira Yudovin-Farber, Rehovot (IL); Efraim Dvash, Rehovot (IL)

(73) Assignee: Stratasys Ltd., Rehovot (IL)

( * ) Notice: Subject to any disclaimer, the term of this patent is extended or adjusted under 35 U.S.C. 154(b) by 253 days.

(21) Appl. No.: 15/128,975

(22) PCT Filed: Mar. 25, 2015

(86) PCT No.: PCT/IL2015/050316
§ 371 (c)(1),
(2) Date: Sep. 25, 2016

(87) PCT Pub. No.: WO2015/145439
PCT Pub. Date: Oct. 1, 2015

(65) Prior Publication Data
US 2017/0203508 A1 Jul. 20, 2017

Related U.S. Application Data

(60) Provisional application No. 61/969,900, filed on Mar. 25, 2014.

(51) Int. Cl.
*B29C 64/112* (2017.01)
*C09D 11/52* (2014.01)
(Continued)

(52) U.S. Cl.
CPC ............ *B29C 64/112* (2017.08); *B33Y 10/00* (2014.12); *B33Y 50/02* (2014.12); *B33Y 70/00* (2014.12);
(Continued)

(58) Field of Classification Search
CPC ......... B33Y 50/02; B33Y 10/00; B33Y 70/00; B29C 64/112; B29C 64/386;
(Continued)

(56) References Cited

U.S. PATENT DOCUMENTS 3,986,546 A 10/1976 Green et al.
4,196,033 A 4/1980 Arai et al.
(Continued)

FOREIGN PATENT DOCUMENTS

CN 1719966 1/2006
CN 102084435 6/2011
(Continued)

OTHER PUBLICATIONS

International Preliminary Report on Patentability dated Oct. 6, 2016 From the International Bureau of WIPO Re. Application No. PCT/IL2015/050316.
(Continued)

*Primary Examiner* — Timothy Kennedy
*Assistant Examiner* — John Robitaille

(57) ABSTRACT

A method of fabricating a cross-layer pattern in a layered object is disclosed. The method is executed by an additive manufacturing system and comprises: dispensing a patterning material onto a receiving medium to form a first pattern element; dispensing a first layer of modeling material onto the first pattern element while forming a first open cavity exposing at least a portion of the first pattern element beneath the first layer; and dispensing patterning material onto the exposed portion of the first pattern element and the first layer to form a second pattern element contacting the first pattern element.

24 Claims, 9 Drawing Sheets

(51) Int. Cl.
*H05K 3/12* (2006.01)
*H05K 3/46* (2006.01)
*B33Y 10/00* (2015.01)
*C09D 11/30* (2014.01)
*B33Y 50/02* (2015.01)
*B33Y 70/00* (2020.01)
*C09D 133/14* (2006.01)
*C09D 133/26* (2006.01)
*H05K 1/18* (2006.01)
*H05K 3/30* (2006.01)
*H05K 1/09* (2006.01)
*B29K 105/00* (2006.01)

(52) U.S. Cl.
CPC .............. *C09D 11/30* (2013.01); *C09D 11/52* (2013.01); *C09D 133/14* (2013.01); *C09D 133/26* (2013.01); *H05K 1/186* (2013.01); *H05K 3/125* (2013.01); *H05K 3/1283* (2013.01); *H05K 3/30* (2013.01); *H05K 3/4664* (2013.01); *B29K 2105/0005* (2013.01); *H05K 1/092* (2013.01); *H05K 2203/013* (2013.01)

(58) Field of Classification Search
CPC ....... B29C 64/147; C09D 11/30; C09D 11/52; C09D 133/14; C09D 133/26; H05K 1/186; H05K 3/125; H05K 3/1283; H05K 3/30; H05K 3/4664
See application file for complete search history.

(56) References Cited

U.S. PATENT DOCUMENTS

| | | | |
|---|---|---|---|
| 4,542,165 A | 9/1985 | Kumata et al. | |
| 5,602,191 A | 2/1997 | Reich et al. | |
| 5,614,602 A | 3/1997 | Connors et al. | |
| 6,096,469 A | 8/2000 | Anderson et al. | |
| 6,259,962 B1 | 7/2001 | Gothait | |
| 6,441,354 B1 | 8/2002 | Seghatol et al. | |
| 6,569,373 B2 | 5/2003 | Napadensky | |
| 6,658,314 B1 | 12/2003 | Gothait | |
| 6,850,334 B1 | 2/2005 | Gothait | |
| 7,183,335 B2 | 2/2007 | Napadensky | |
| 7,209,797 B2 | 4/2007 | Kritchman et al. | |
| 7,225,045 B2 | 5/2007 | Gothait et al. | |
| 7,300,619 B2 | 11/2007 | Napadensky et al. | |
| 7,500,846 B2 | 3/2009 | Eshed et al. | |
| 7,676,913 B2 * | 3/2010 | Imai .................... | H05K 3/4664 174/250 |
| 8,008,364 B2 | 8/2011 | Shimada et al. | |
| 8,534,787 B2 | 9/2013 | Yafe | |
| 2001/0025003 A1 | 9/2001 | Sakai et al. | |
| 2002/0149659 A1 | 10/2002 | Wu et al. | |
| 2003/0099708 A1 | 5/2003 | Rowe et al. | |
| 2004/0135269 A1 | 7/2004 | Otsuki | |
| 2004/0167007 A1 | 8/2004 | Bedard | |
| 2005/0104241 A1 | 5/2005 | Kritchman et al. | |
| 2006/0005994 A1 | 1/2006 | Imai et al. | |
| 2006/0013970 A1 | 1/2006 | Wada | |
| 2006/0054039 A1 | 3/2006 | Kritchman et al. | |
| 2006/0068573 A1 * | 3/2006 | Shintate ............... | H05K 3/4664 438/584 |
| 2007/0165076 A1 | 7/2007 | Imken et al. | |
| 2007/0196320 A1 | 8/2007 | Yasin | |
| 2008/0150187 A1 | 6/2008 | Daniel et al. | |
| 2008/0187711 A1 | 8/2008 | Alam et al. | |
| 2008/0281019 A1 | 11/2008 | Giller et al. | |
| 2009/0107546 A1 | 4/2009 | Allison et al. | |
| 2009/0110889 A1 | 4/2009 | Toyoda | |
| 2009/0114432 A1 | 5/2009 | Tsurumi | |
| 2009/0212035 A1 | 8/2009 | Herrmann et al. | |
| 2010/0000762 A1 | 1/2010 | Yang et al. | |
| 2010/0001435 A1 | 1/2010 | Manley et al. | |
| 2010/0130629 A1 | 5/2010 | Kometani et al. | |
| 2010/0191360 A1 | 7/2010 | Napadensky et al. | |
| 2011/0021808 A1 | 1/2011 | Nair et al. | |
| 2011/0212382 A1 | 9/2011 | Randall et al. | |
| 2011/0267673 A1 | 11/2011 | Agrawal et al. | |
| 2012/0168684 A1 | 7/2012 | Magdassi et al. | |
| 2013/0186672 A1 | 7/2013 | Kariya et al. | |
| 2013/0208064 A1 | 8/2013 | Ueda et al. | |
| 2013/0256957 A1 | 10/2013 | Ishigami et al. | |
| 2014/0036455 A1 | 2/2014 | Napadensky | |
| 2014/0242362 A1 | 8/2014 | Nakato et al. | |
| 2014/0314966 A1 | 10/2014 | Fink et al. | |
| 2015/0056382 A1 | 2/2015 | Suganuma et al. | |
| 2015/0104562 A1 | 4/2015 | Subbaraman et al. | |
| 2015/0105481 A1 | 4/2015 | Hessing et al. | |
| 2015/0196493 A1 | 7/2015 | Szymczak et al. | |
| 2015/0247055 A1 | 9/2015 | Takahashi et al. | |
| 2015/0259247 A1 | 9/2015 | Watanabe | |
| 2015/0366073 A1 | 12/2015 | Magdassi et al. | |
| 2017/0137327 A1 | 5/2017 | Capobianco et al. | |
| 2018/0295728 A1 | 10/2018 | Yudovin-Farber et al. | |
| 2018/0311892 A1 | 11/2018 | Abbott, Jr. et al. | |

FOREIGN PATENT DOCUMENTS

| | | |
|---|---|---|
| CN | 102686777 | 9/2012 |
| CN | 103154316 | 6/2013 |
| EP | 214 815 | 3/1987 |
| EP | 0450381 | 10/1991 |
| EP | 2001656 | 12/2008 |
| JP | 04296542 | 10/1992 |
| JP | 2001-144217 | 5/2001 |
| JP | 2003-257769 | 9/2003 |
| JP | 2004-055965 | 2/2004 |
| JP | 2006-024768 | 1/2006 |
| JP | 2006-032535 | 2/2006 |
| JP | 2006-121039 | 5/2006 |
| JP | 2009-021552 | 1/2009 |
| JP | 2011-031591 | 2/2011 |
| JP | 2011-054620 | 3/2011 |
| JP | 2012-521493 | 9/2012 |
| JP | 2014-514193 | 6/2014 |
| KR | 10-1998-0041872 | 8/1998 |
| TW | I425899 | 2/2014 |
| WO | WO 2008/102266 | 8/2008 |
| WO | WO 2010/109465 | 9/2010 |
| WO | WO2011/073638 | 6/2011 |
| WO | WO 2012/143923 | 10/2012 |
| WO | WO 2012/168941 | 12/2012 |
| WO | WO2013/153360 | 10/2013 |
| WO | WO2014/006934 | 1/2014 |
| WO | WO 2014/118783 | 8/2014 |
| WO | WO2014/185102 | 11/2014 |
| WO | WO 2015/145439 | 10/2015 |
| WO | WO 2016/151586 | 9/2016 |

OTHER PUBLICATIONS

International Search Report and the Written Opinion dated Jul. 3, 2016 From the International Searching Authority Re. Application No. PCT/ IL2016/050314.
International Search Report and the Written Opinion dated Jun. 21, 2015 From the International Searching Authority Re. Application No. PCT/ IL2015/050316.
Notification of Office Action and Search Report dated Jul. 27, 2018 From the State Intellectual Property Office of the People's Republic of China Re. Application No. 201580026748.1 and Its Summary in English. (11 Pages).
Supplementary European Search Report and the European Search Opinion dated Nov. 28, 2018 From the European Patent Office Re. Application No. 16767878.8. (10 pages).
Grouchko et al. "Conductive Inks With a 'Built-In' Mechanism That Enables Sintering at Room Temperature", ACS Nano, XP002684747, 5(4): 3354-3359, Published Online Mar. 25, 2011. P.3345.

(56) References Cited

OTHER PUBLICATIONS

Communication Pursuant to Article 94(3) EPC dated Sep. 10, 2018 From the European Patent Office Re. Application No. 15768896.1. (5 Pages).
Translation dated Sep. 3, 2018 of Notification of Office Action dated Jul. 27, 2018 From the State Intellectual Property Office of the People's Republic of China Re. Application No. 201580026748.1. (9 Pages).
Supplementary European Search Report and the European Search Opinion dated Nov. 7, 2017 From the European Patent Office Re. Application No. 15768896.1. (7 Pages).
International Preliminary Report on Patentability dated Oct. 5, 2017 From the International Bureau of WIPO Re. Application No. PCT/IL2016/050314. (9 Pages).
Notification of Office Action and Search Report dated Feb. 3, 2019 From the State Intellectual Property Office of the People's Republic of China Re. Application No. 201680029611.6. (8 Pages).
Notice of Reasons for Rejection dated Jan. 29, 2019 From the Japan Patent Office Re. Application No. 2016-558572 and Its Translation Into English. (9 Pages).
Translation dated Mar. 13, 2019 of Notification of Office Action dated Feb. 3, 2019 From the State Intellectual Property Office of the People's Republic of China Re. Application No. 201680029611.6. (6 Pages).
Notification of Office Action dated May 30, 2019 From the State Intellectual Property Office of the People's Republic of China Re. Application No. 201580026748.1 and Its Translation Into English. (16 Pages).
Office Action dated Dec. 31, 2019 From the Israel Patent Office Re. Application No. 248023 and Its Translation Into English. (7 pages).
Official Action dated Jan. 10, 2020 From the US Patent and Trademark Office Re. U.S. Appl. No. 15/557,814. (42 pages).
STN "STN Next Search", Uploading Structure File: 2019 0009 Structure, 25 Pages, 2019.
Notice of Reasons for Rejection dated Mar. 3, 2020 From the Japan Patent Office Re. Application No. 2017-549387 and Its Translation Into English.
Notification of Office Action and Search Report dated Aug. 20, 2019 From the State Intellectual Property Office of the People's Republic of China Re. Application No. 201680029611.6. (9 Pages).
Official Action dated Jul. 29, 2019 From the US Patent and Trademark Office Re. U.S. Appl. No. 15/557,814. (49 pages).
Translation dated Aug. 29, 2019 of Notification of Office Action dated Aug. 20, 2019 From the State Intellectual Property Office of the People's Republic of China Re. Application No. 201680029611.6. (5 Pages).
Notice of Reason(s) for Rejection dated Dec. 8, 2020 From the Japan Patent Office Re. Application No. 2017-549387 and Its Translation Into English. (5 Pages).
Office Action dated Sep. 24, 2020 From the Israel Patent Office Re. Application No. 248023 and Its Translation Into English. (11 Pages).
Notice of Reasons for Rejection dated Sep. 15, 2020 From the Japan Patent Office Re. Application No. 2019-148754. (8 Pages).
Notice of Preliminary Rejection dated Apr. 20, 2020 From the Korean Intellectual Property Office Re. Application No. 10-2016-7029174 and Its Translation Into English. (11 Pages).
Notification of Office Action and Search Report dated Apr. 22, 2020 From the State Intellectual Property Office of the People's Republic of China Re. Application No. 201680029611.6. (11 Pages).
Translation dated May 25, 2020 of Notification of Office Action dated Apr. 22, 2020 From the State Intellectual Property Office of the People's Republic of China Re. Application No. 201680029611.6. (10 Pages).
Office Action dated Mar. 16, 2021 From the Israel Patent Office Re. Application No. 248023 and Its Translation Into English. (9 Pages).
Official Action dated May 17, 2021 from the U.S. Patent and Trademark Office Re. U.S. Appl. No. 15/557,814, (29 pages).

\* cited by examiner

METHOD AND SYSTEM FOR FABRICATING CROSS-LAYER PATTERN

RELATED APPLICATIONS

This application is a National Phase of PCT Patent Application No. PCT/IL2015/050316 having International filing date of Mar. 25, 2015, which claims the benefit of priority under 35 USC § 119(e) of U.S. Provisional Patent Application No. 61/969,900 filed on Mar. 25, 2014.

The contents of the above applications are all incorporated by reference as if fully set forth herein in their entirety.

FIELD AND BACKGROUND OF THE INVENTION

The present invention, in some embodiments thereof, relates to freeform fabrication and, more particularly, but not exclusively, to a method and system for freeform fabrication of a cross-layer pattern.

Solid Freeform Fabrication (SFF) is a technology enabling fabrication of arbitrarily shaped structures directly from computer data via additive formation steps. The basic operation of any SFF system consists of slicing a three-dimensional computer model into thin cross sections, translating the result into two-dimensional position data and feeding the data to control equipment which fabricates a three-dimensional structure in a layerwise manner.

Additive manufacturing (AM) includes several manufacturing techniques in which material is dispensed layer by layer to form a final product. One AM technique, is known as three dimensional (3D) inkjet printing. In this technique, a building material is dispensed from a dispensing head having a set of nozzles to deposit layers on a supporting structure. Depending on the building material, the layers may then be cured or solidified using a suitable device. The building material may include modeling material, which forms the object, and support material, which supports the object as it is being built. Various three-dimensional printing techniques exist and are disclosed in, e.g., U.S. Pat. Nos. 6,259,962, 6,569,373, 6,658,314, 6,850,334, 7,183,335 7,209,797, 7,300,619, 7,225,045, and 7,500,846, and U.S. Published Applications Nos. 20050104241 and 20060054039, all of the same Assignee, the contents of which are hereby incorporated by reference.

Deposition and printing methods for printing two dimensional (2D) electrical conductive elements on a flat substrate are also known. For example, U.S. Pat. No. 8,534,787 discloses a printing bridge that accommodates a jet print head that moves above an object. The jet print head includes first jet nozzles for injecting a first type substance onto the surface of the object, and second jet nozzles for injecting a second type of substance onto the surface of the object. The first type substance is utilized for printing a solder mask pattern and the second type substance is utilized for printing a legend pattern.

SUMMARY OF THE INVENTION

According to an aspect of some embodiments of the present invention there is provided a method of fabricating a cross-layer pattern in a layered object. The method being executed by an additive manufacturing system and comprises: dispensing a patterning material onto a receiving medium to form a first pattern element; dispensing a first layer of modeling material onto the first pattern element while forming a first open cavity exposing at least a portion of the first pattern element beneath the first layer; and dispensing patterning material onto the exposed portion of the first pattern element and the first layer to form a second pattern element contacting the first pattern element, thereby forming a cross-layer pattern of the patterning material.

According to some embodiments of the invention the first open cavity comprises a non-vertical wall, and wherein the dispensing of the patterning material onto the exposed portion of the first pattern element comprises dispensing the patterning material also onto the non-vertical wall.

According to some embodiments of the invention the method comprises dispensing a second layer of modeling material onto the first layer.

According to some embodiments of the invention the dispensing of the second layer comprises leaving at least a portion of the second pattern element exposed beneath the second layer.

According to some embodiments of the invention the dispensing of the second layer comprises forming a second open cavity in the second layer thereby exposing the portion of the second pattern element beneath the second layer.

According to some embodiments of the invention the dispensing of the second layer is executed before the dispensing of the patterning material to form the second pattern element.

According to some embodiments of the invention the dispensing of the second layer is executed so as to deepen and widen the first cavity.

According to some embodiments of the invention the dispensing of the second layer is executed so as to form a step wall in the first cavity.

According to some embodiments of the invention the dispensing of the patterning material to form the second pattern element is executed such that the second pattern element is below a top surface of the second layer by its entirety.

According to some embodiments of the invention the dispensing of the patterning material to form the second pattern element is executed such that the second pattern element is below a top surface of the second layer by its entirety.

According to some embodiments of the invention the method comprises leveling the second layer following the dispensing of the patterning material to form the second pattern.

According to some embodiments of the invention the dispensing of the second layer comprises filling the first cavity by modeling material.

According to some embodiments of the invention the dispensing of the first layer and the dispensing of the second layer are by different dispensing heads of the additive manufacturing system, each head dispensing a different modeling material.

According to some embodiments of the invention the method comprises alternately repeating the dispensing of the patterning material and the layer of modeling material a plurality of times, to form a plurality of layers of modeling material, and a plurality of pattern elements interconnected to form a continuous pattern crossing the plurality of layers.

According to some embodiments of the invention the at least two of the layers are dispensed by different dispensing heads of the additive manufacturing system, each head dispensing a different modeling material.

According to some embodiments of the invention the patterning material is conductive.

According to some embodiments of the invention the patterning material comprises a conductive ink.

According to some embodiments of the invention a thickness of each of the pattern element is at least two times less than a thickness of the layer.

According to some embodiments of the invention the method comprises placing an electronic or electric device in the cavity, wherein the pattern element is conductive and wherein the pattern element contacts an electric terminal of the device.

According to some embodiments of the invention the method comprises sintering the pattern element.

According to some embodiments of the invention the sintering is effected by a technique selected from the group consisting of thermal sintering, photonic sintering, plasma sintering and microwave sintering.

According to some embodiments of the invention the modeling material comprises a sintering inducing agent, and wherein the dispensing of the modeling material and/or the patterning material is executed such that the sintering inducing agent reacts with the patterning material to sinter the patterning element.

According to some embodiments of the invention the sintering inducing agent comprises a compound selected from the group consisting of free radical polymerizable compound, cationic polymerizable compound and anionic polymerizable compound.

According to some embodiments of the invention the sintering inducing agent comprises an ionic group and a counter ion, the ionic group being an acrylic monomer or derivative.

According to some embodiments of the invention the sintering inducing agent is a salt.

According to some embodiments of the invention the method comprises the counter ion is anionic and the ion group is cationic.

According to some embodiments of the invention the counter anion is selected from the group consisting of a halogen anion, a sulfate anion, a perchlorate anion, a chlorate anion, a nitrate anion, a carboxylate anion, a p-toluenesulfonate anion, and an alkanesulfonate anion.

According to some embodiments of the invention the counter anion is selected from the group consisting of chloride, sulfate, nitrate, phosphate, carboxylate and halogen.

According to some embodiments of the invention the counter anion is chloride.

According to some embodiments of the invention the method comprises the ionic group selected from the group consisting of an acrylate, a methacrylate, an acrylamide, a methacrylamide, an oligomer and a polymer.

According to some embodiments of the invention the cationic group is a quaternary ammonium group.

According to some embodiments of the invention the cationic group is selected from the group consisting of poly(diallyldimethylammonium chloride), cationically charged polyimide, polyethyleneimine and polypyrrole.

According to some embodiments of the invention the sintering inducing agent is a (meth)acrylate derivative having the general formula:

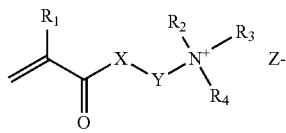

wherein: X is O or NH, Y is a substituted or unsubstituted hydrocarbon chain from 1 to 20 carbon atoms in length, $R_1$ is H (in which case the salt is an acrylate derivative) or $CH_3$ (in which case the salt is a methacrylate derivative), $R_2$-$R_4$ are each independently an alkyl, optionally $C_{1-4}$ alkyl, and Z is an anion. According to some embodiments of the invention Y is an unsubstituted hydrocarbon chain. According to some embodiments of the invention $R_2$-$R_4$ are each independently methyl or ethyl. According to some embodiments of the invention $R_2$-$R_4$ are each methyl.

According to some embodiments of the invention the sintering inducing agent selected from the group consisting of acrylate, trimethyl ammonium methyl methacrylate chloride, 3-trimethyl ammonium propyl methacrylamide chloride, acrylamide.

According to an aspect of some embodiments of the present invention there is provided a computer software product. The computer software product comprises a computer-readable medium in which program instructions are stored, which instructions, when read by a computerized controller of an additive manufacturing system, cause the system to execute the method as delineated above and optionally and preferably as further detailed below.

According to an aspect of some embodiments of the present invention there is provided a system of fabricating a cross-layer pattern in a layered object by additive manufacturing. The system comprises: a plurality of dispensing heads, wherein at least one dispensing head is configured for dispensing a modeling material, and at least one dispensing head is configured for dispensing patterning material; and a controller configured for operating the dispensing heads to dispense a patterning material onto a receiving medium to form a first pattern element, to dispense a first layer of modeling material onto the first pattern element while forming a first open cavity exposing at least a portion of the first pattern element beneath the first layer, and to dispense patterning material onto the exposed portion of the first pattern element and the first layer to form a second pattern element contacting the first pattern element.

According to some embodiments of the invention the first open cavity comprises a non-vertical wall, and wherein the controller is configured for operating the dispensing heads to dispense the patterning material also onto the non-vertical wall.

According to some embodiments of the invention the non vertical wall is planar. According to some embodiments of the invention the non vertical wall is curved.

According to some embodiments of the invention the controller is configured for operating the dispensing heads to dispense a second layer of modeling material onto the first layer.

According to some embodiments of the invention the controller is configured for operating the dispensing heads to dispense the second layer while leaving at least a portion of the second pattern element exposed beneath the second layer.

According to some embodiments of the invention the controller is configured for operating the dispensing heads to form a second open cavity in the second layer thereby exposing the portion of the second pattern element beneath the second layer.

According to some embodiments of the invention the controller is configured for operating the dispensing heads to dispense the second layer before the dispensing of the patterning material to form the second pattern element.

According to some embodiments of the invention the controller is configured for operating the dispensing heads to dispense the second layer so as to deepen and widen the first cavity.

According to some embodiments of the invention the controller is configured for operating the dispensing heads to dispense the second layer is so as to form a step wall in the first cavity.

According to some embodiments of the invention the controller is configured for operating the dispensing heads to dispense the patterning material to form the second pattern element such that the second pattern element is below a top surface of the second layer by its entirety.

According to some embodiments of the invention the system comprises a leveling device configured for leveling the second layer, wherein the controller is configured for operating the leveling device following the dispensing of the patterning material to form the second pattern.

According to some embodiments of the invention the controller is configured for filling the first cavity by modeling material.

According to some embodiments of the invention the second cavity is laterally displaced relative to the first cavity.

According to some embodiments of the invention the first layer and the second layer are dispensed by different dispensing heads of the system, each head dispensing a different modeling material.

According to an aspect of some embodiments of the present invention there is provided an object manufactured by additive manufacturing, the object comprising a plurality of layers of modeling material, and a plurality of pattern elements interconnected to form a continuous pattern crossing the plurality of layers.

According to some embodiments of the invention the object wherein the pattern elements are electrically conductive.

According to some embodiments of the invention at least one of the plurality of pattern elements is exposed to the environment at an end of a layer of modeling material.

According to some embodiments of the invention the object comprises an electronic or electric device embedded in the object, wherein the pattern elements are conductive and wherein at least one of the pattern elements contacts an electric terminal of the device.

According to some embodiments of the invention the object is or serves as a component in electronic circuitry.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1A:
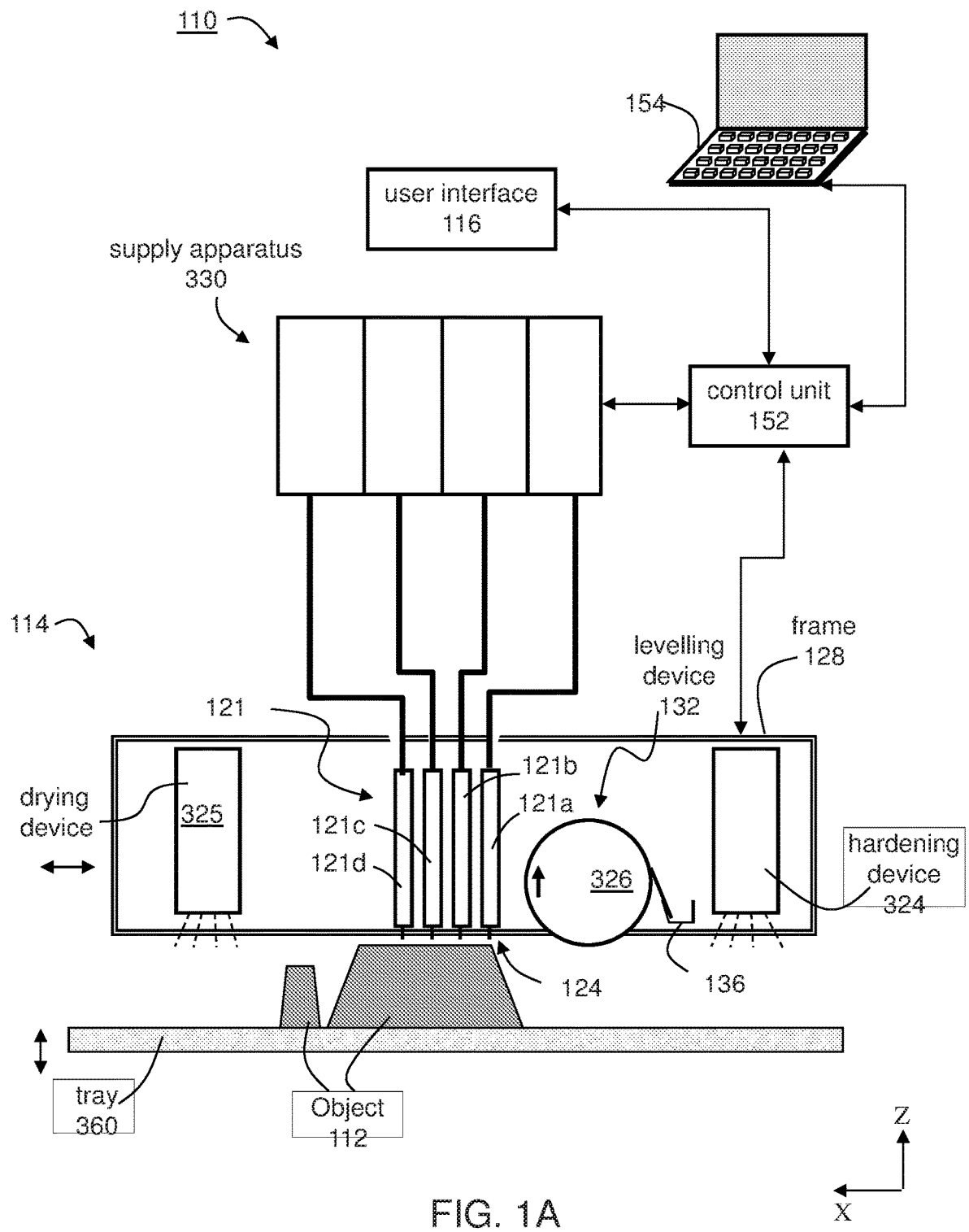
FIGS. 1A and 1B are high level schematic block diagrams of an additive manufacturing system according to some embodiments of the invention.

The present invention, in some embodiments thereof, relates to freeform fabrication and, more particularly, but not exclusively, to a method and system for freeform fabrication of a cross-layer pattern.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The method and system of the present embodiments manufacture three-dimensional objects based on computer object data in a layerwise manner by forming a plurality of layers in a configured pattern corresponding to the shape of the objects. The computer object data can be in any known format, including, without limitation, a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD).

The term "object" as used herein refers to a whole object or a part thereof.

Each layer is formed by additive manufacturing apparatus which scans a two-dimensional surface and patterns it. While scanning, the apparatus visits a plurality of target locations on the two-dimensional layer or surface, and decides, for each target location or a group of target locations, whether or not the target location or group of target locations is to be occupied by building material, and which type of building material is to be delivered thereto. The decision is made according to a computer image of the surface.

In preferred embodiments of the present invention the AM comprises three-dimensional printing, more preferably three-dimensional inkjet printing. In these embodiments a building material is dispensed from a dispensing head having a set of nozzles to deposit building material in layers on a supporting structure. The AM apparatus thus dispenses building material in target locations which are to be occupied and leaves other target locations void. The apparatus typically includes a plurality of dispensing heads, each of which can be configured to dispense a different building material. Thus, different target locations can be occupied by different building materials. The types of building materials can be categorized into two major categories: modeling material and support material. The support material serves as a supporting matrix or construction for supporting the object or object parts during the fabrication process and/or other purposes, e.g., providing hollow or porous objects. Support constructions may additionally include modeling material elements, e.g. for further support strength.

The modeling material is generally a composition which is formulated for use in additive manufacturing and which is able to form a three-dimensional object on its own, i.e., without having to be mixed or combined with any other substance.

The final three-dimensional object is made of the modeling material or a combination of modeling materials or modeling and support materials or modification thereof (e.g., following curing). All these operations are well-known to those skilled in the art of solid freeform fabrication.

In some exemplary embodiments of the invention an object is manufactured by dispensing two or more different modeling materials, each material from a different dispensing head of the AM. The materials are optionally and preferably deposited in layers during the same pass of the printing heads. The materials and combination of materials within the layer are selected according to the desired properties of the object.

Figure 1B:
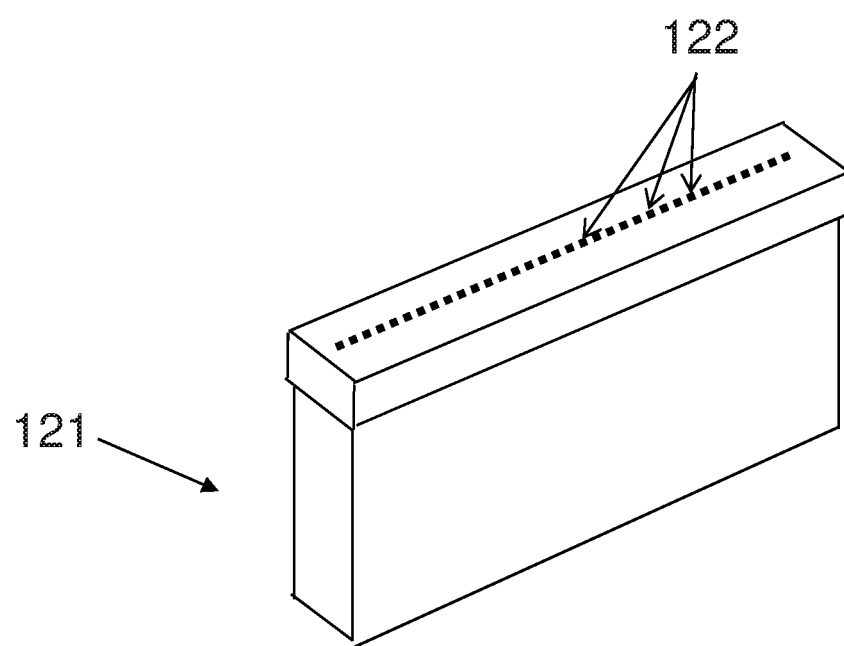

A representative and non-limiting example of a system 110 suitable for AM of an object 112 according to some embodiments of the present invention is illustrated in FIGS. 1A-B. System 110 comprises an additive manufacturing apparatus 114 having a dispensing unit 121 which comprises a plurality of dispensing heads. Each head preferably comprises an array of one or more nozzles 122, as illustrated in FIG. 1B, through which a liquid building material 124 is dispensed.

Preferably, but not obligatorily, apparatus 114 is a three-dimensional printing apparatus, in which case the dispensing heads are printing heads, and the building material is dispensed via inkjet technology. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, fused deposition modeling apparatus and fused material deposition apparatus.

Each dispensing head is optionally and preferably fed via a building material reservoir which may optionally include a temperature control unit (e.g., a temperature sensor and/or a heating device), and a material level sensor. To dispense the building material, a voltage signal is applied to the dispensing heads to selectively deposit droplets of material via the dispensing head nozzles, for example, as in piezoelectric inkjet printing technology. The dispensing rate of each head depends on the number of nozzles, the type of nozzles and the applied voltage signal rate (frequency). Such dispensing heads are known to those skilled in the art of solid freeform fabrication.

Preferably, but not obligatorily, the overall number of dispensing nozzles or nozzle arrays is selected such that half of the dispensing nozzles are designated to dispense support material and half of the dispensing nozzles are designated to dispense modeling material, i.e. the number of nozzles jetting modeling materials is the same as the number of nozzles jetting support material. In the representative example of FIG. 1A, four dispensing heads $121a$, $121b$, $121c$ and $121d$ are illustrated. Each of heads $121a$, $121b$, $121c$ and $121d$ has a nozzle array. In this Example, heads $121a$ and $121b$ can be designated for modeling material/s and heads $121c$ and $121d$ can be designated for support material. Thus, head $121a$ can dispense a first modeling material, head $121b$ can dispense a second modeling material and heads $121c$ and $121d$ can both dispense support material. In an alternative embodiment, heads $121c$ and $121d$, for example, may be combined in a single head having two nozzle arrays for depositing support material.

Yet it is to be understood that it is not intended to limit the scope of the present invention and that the number of modeling material depositing heads (modeling heads) and the number of support material depositing heads (support heads) may differ. Generally, the number of modeling heads, the number of support heads and the number of nozzles in each respective head or head array are selected such as to provide a predetermined ratio, a, between the maximal dispensing rate of the support material and the maximal dispensing rate of modeling material. The value of the predetermined ratio, a, is preferably selected to ensure that in each formed layer, the height of modeling material equals the height of support material. Typical values for a are from about 0.6 to about 1.5.

As used herein the term "about" refers to ±10%.

For example, for a=1, the overall dispensing rate of support material is generally the same as the overall dispensing rate of the modeling material when all modeling heads and support heads operate.

In a preferred embodiment, there are M modeling heads each having m arrays of p nozzles, and S support heads each having s arrays of q nozzles such that M×m×p=S×s×q. Each of the M×m modeling arrays and S×s support arrays can be manufactured as a separate physical unit, which can be assembled and disassembled from the group of arrays. In this embodiment, each such array optionally and preferably comprises a temperature control unit and a material level sensor of its own, and receives an individually controlled voltage for its operation.

Apparatus 114 can further comprise a hardening device 324 which can include any device configured to emit light, heat or the like that may cause the deposited material to hardened. For example, hardening device 324 can comprise one or more radiation sources, which can be, for example, an ultraviolet or visible or infrared lamp, or other sources of electromagnetic radiation, or electron beam source, depending on the modeling material being used. In some embodiments of the present invention, hardening device 324 serves for curing or solidifying the modeling material.

The dispensing head and radiation source are preferably mounted in a frame or block 128 which is preferably operative to reciprocally move over a tray 360, which serves as the working surface. In some embodiments of the present invention the radiation sources are mounted in the block such that they follow in the wake of the dispensing heads to at least partially cure or solidify the materials just dispensed by the dispensing heads. Tray 360 is positioned horizontally. According to the common conventions an X-Y-Z Cartesian coordinate system is selected such that the X-Y plane is parallel to tray 360. Tray 360 is preferably configured to move vertically (along the Z direction), typically downward. In various exemplary embodiments of the invention, apparatus 114 further comprises one or more leveling devices 132, e.g. a roller 326. Leveling device 326 serves to straighten, level and/or establish a thickness of the newly formed layer prior to the formation of the successive layer thereon. Leveling device 326 preferably comprises a waste collection device 136 for collecting the excess material generated during leveling. Waste collection device 136 may comprise any mechanism that delivers the material to a waste tank or waste cartridge.

In use, the dispensing heads of unit 121 move in a scanning direction, which is referred to herein as the X direction, and selectively dispense building material in a predetermined configuration in the course of their passage over tray 360. The building material typically comprises one or more types of support material and one or more types of modeling material. The passage of the dispensing heads of unit 121 is followed by the curing of the modeling material (s) by radiation source 126. In the reverse passage of the heads, back to their starting point for the layer just deposited, an additional dispensing of building material may be carried out, according to predetermined configuration. In the forward and/or reverse passages of the dispensing heads, the layer thus formed may be straightened by leveling device 326, which preferably follows the path of the dispensing heads in their forward and/or reverse movement. Once the dispensing heads return to their starting point along the X direction, they may move to another position along an indexing direction, referred to herein as the Y direction, and continue to build the same layer by reciprocal movement along the X direction. Alternately, the dispensing heads may move in the Y direction between forward and reverse movements or after more than one forward-reverse movement. The series of scans performed by the dispensing heads to complete a single layer is referred to herein as a single scan cycle.

Once the layer is completed, tray 360 is lowered in the Z direction to a predetermined Z level, according to the desired thickness of the layer subsequently to be printed. The procedure is repeated to form three-dimensional object 112 in a layerwise manner.

In another embodiment, tray 360 may be displaced in the Z direction between forward and reverse passages of the dispensing head of unit 121, within the layer. Such Z displacement is carried out in order to cause contact of the leveling device with the surface in one direction and prevent contact in the other direction.

System 110 optionally and preferably comprises a building material supply system 330 which comprises the building material containers or cartridges and supplies a plurality of building materials to fabrication apparatus 114.

A control unit 340 controls fabrication apparatus 114 and optionally and preferably also supply system 330. Control unit 340 typically includes an electronic circuit configured to perform the controlling operations. Control unit 340 preferably communicates with a data processor 154 which transmits digital data pertaining to fabrication instructions based on computer object data, e.g., a CAD configuration represented on a computer readable medium in a form of a Standard Tessellation Language (STL) format or the like. Typically, control unit 340 controls the voltage applied to each dispensing head or nozzle array and the temperature of the building material in the respective printing head.

Once the manufacturing data is loaded to control unit 340 it can operate without user intervention. In some embodiments, control unit 340 receives additional input from the operator, e.g., using data processor 154 or using a user interface 116 communicating with unit 340. User interface 116 can be of any type known in the art, such as, but not limited to, a keyboard, a touch screen and the like. For example, control unit 340 can receive, as additional input, one or more building material types and/or attributes, such as, but not limited to, color, characteristic distortion and/or transition temperature, viscosity, electrical property, magnetic property. Other attributes and groups of attributes are also contemplated.

Some embodiments contemplate the fabrication of an object by dispensing different materials from different dispensing heads. These embodiments provide, inter alia, the ability to select materials from a given number of materials and define desired combinations of the selected materials and their properties. According to the present embodiments, the spatial locations of the deposition of each material with the layer is defined, either to effect occupation of different three-dimensional spatial locations by different materials, or to effect occupation of substantially the same three-dimensional location or adjacent three-dimensional locations by two or more different materials so as to allow post deposition spatial combination of the materials within the layer, thereby to form a composite material at the respective location or locations.

Any post deposition combination or mix of modeling materials is contemplated. For example, once a certain material is dispensed it may preserve its original properties. However, when it is dispensed simultaneously with another modeling material or other dispensed materials which are dispensed at the same or nearby locations, a composite material having a different property or properties to the dispensed materials is formed.

The present embodiments thus enable the deposition of a broad range of material combinations, and the fabrication of an object which may consist of multiple different combinations of materials, in different parts of the object, according to the properties desired to characterize each part of the object.

Further details on the principles and operations of an AM system such as system 110 are found in U.S. Published Application No. 20100191360, the contents of which are hereby incorporated by reference.

In some embodiments of the present invention the AM system is operated to selectively dispense a modeling material and a patterning material to form a cross-layer pattern. The modeling material is preferably an electrically non-conductive material (e.g., a curable polymer) and the patterning material is preferably an electrically conductive material. In this preferred embodiment, the AM system is operated to form a layered 3D object that includes an electrically conductive pattern, formed during deposition of the layers. In some embodiments, the patterning material is a thermally conductive material, in which case heat conductive connections are formed within the 3D object. The method of the present embodiments can be used for forming segments of patterning material (e.g., electrically conductive segments) along any direction, including a horizontal direction (in-plane or parallel to the horizontal plane), a tilted direction relative to the horizontal plane, and the vertical direction (perpendicular to the horizontal direction).

In some embodiments, electrical or electronic components such as a microchip, a battery, a lamp or a PCB can be inserted inside the 3D object during the deposition process while creating an electrical connection to the electrical device or electronic component by selectively depositing electrically conductive material forming electrical contacts during the deposition of the building material.

The patterning material is preferably dispensed intermittently to form a plurality of interconnected pattern elements (e.g., a plurality of interconnected conductive elements). The thickness of each pattern element is preferably different from the thickness of the deposited layers of building material. Typically, the thickness of a pattern element is at least 2 times or at least 3 times or at least 5 times or at least 10 times or at least 50 times or at least 100 times or at least 500 times or at least 1000 times less than a thickness of a modeling material layer onto which or below which the pattern element is dispensed. For example, the layers of building (modeling or support) material may have a thickness of 5-1000 μm, more preferably 10-100 μm, more preferably 10-50 μm, whereas the pattern elements may have a thickness of 0.1-100 μm, more preferably 0.1-10 μm, more preferably 0.1-5 μm, more preferably 0.1-3 μm.

The dispensed modeling material (for example, for forming non-conductive regions) differs from the patterning material (used, for example, for forming conductive patterns). The modeling material preferably has a viscosity of from about 10 cPs to about 15 cPs at the working temperature of the AM system (typically, but not necessarily from about 40° C. to about 100° C., e.g., about 75° C.). The patterning material is optionally and preferably a conductive ink which comprises conductive particles dispersed in a liquid solvent. When the solvent evaporates the thickness of the region that this ink occupies is reduced, for example, to the aforementioned thickness range of 0.1-3 μm.

In various preferred embodiments of the invention the post dispensing processes for the building material is different from the post dispensing processes for the patterning material. For example, the building (modeling, support) material is typically hardened or cured after it is dispensed as further detailed hereinabove. The patterning material can be dried to evaporate the solvent. When the patterning material is a conductive ink comprising conductive particles dispersed in a liquid solvent, the drying may result in a reduced electrical conductivity, due to the presence of various components such as stabilization agents and the like in the conductive ink, which components form insulating layers between the particles. In these cases, the conductive ink is preferably also sintered to consolidate the conductive particles therein.

When different post dispensing processes are employed for the patterning and building materials, the AM system preferably includes separate dispensing blocks, as explained below with reference to FIG. 2. Alternatively, the building and patterning materials can be dispensed using the same dispensing block (albeit from different dispensing heads), in which case the dispensing block preferably includes both a hardening device 324 for hardening the non-conductive regions and a drying device 325 for evaporating liquid from the conductive regions. In these embodiments, hardening device 324 and drying device 325 are selectively operated by the control unit 340, depending on the type of material being dispensed.

Figure 2:
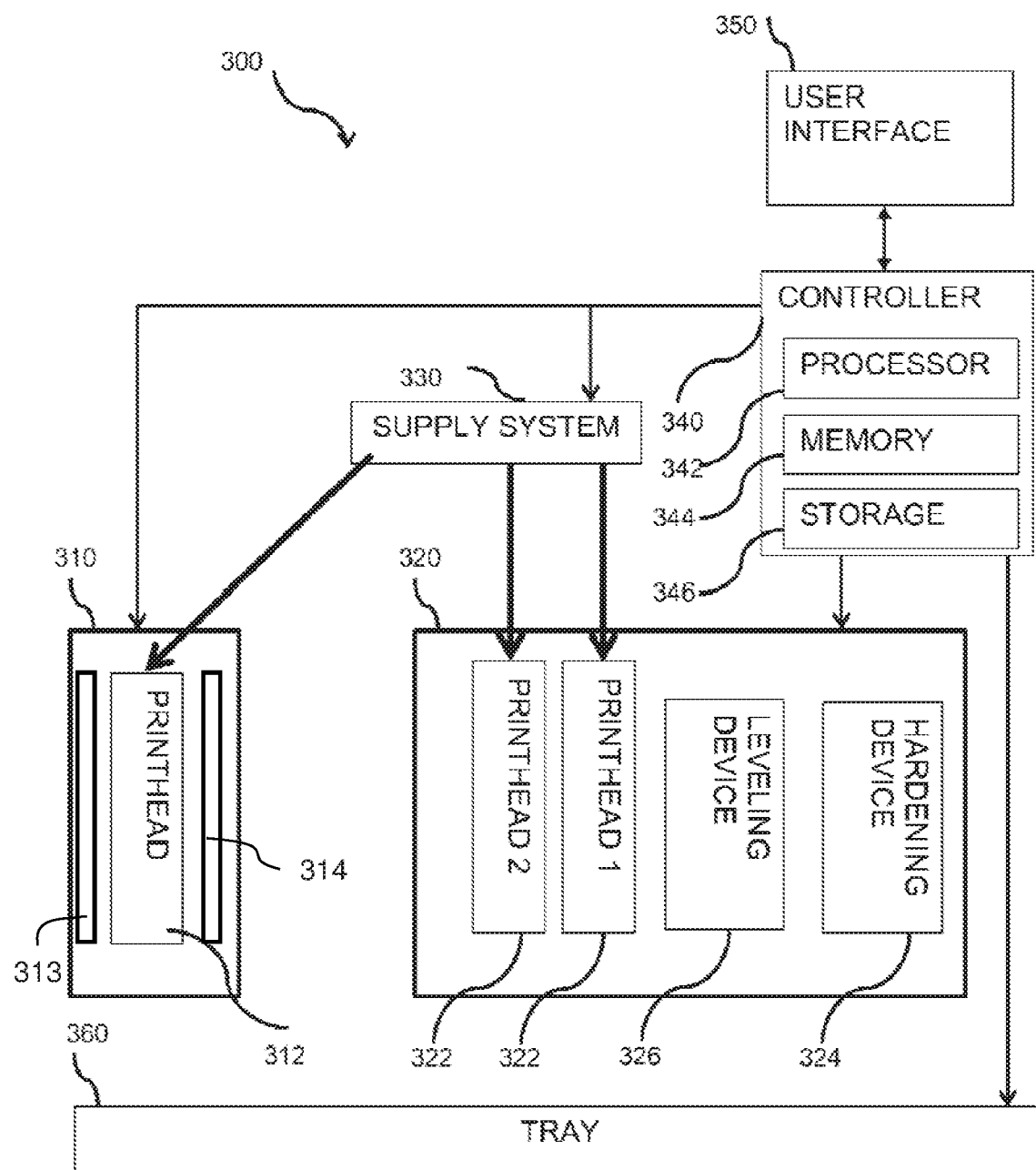
FIG. 2 is a high level schematic block diagram of an additive manufacturing system having separate dispensing blocks according to some embodiments of the invention.

FIG. 2 illustrates an AM system 300 that optionally and preferably includes a first printing block 310, a second printing block 320, a supply system 330, one or more controllers 340, a user interface 350 and a fabrication platform or a tray 360. Controller or controllers 340 may be configured to control all the other elements of system 300.

First block 310 may include one or more dispensing heads 312, for dispensing a patterning material (e.g., a conductive ink) to form a pattern. The principle and operations of dispensing heads 312 can be similar to those described above with respect to dispensing heads 112a-d, adapted to dispense a patterning material instead of a building material. Block 312 may further include a drying device 314 for drying and evaporating the solvent from the conducting ink. The drying device 314 may include: a laser beam, an ultraviolet (UV) lamp, a heating plate or the like. Optionally, block 312 may include a sintering device 313 for sintering the conductive ink. Device 313 can be configured for applying any type of radiation-based or heat-based sintering, including, without limitation, thermal sintering, photonic sintering, plasma sintering and microwave sintering. Specifically, when it is desired to apply thermal sintering, device 313 can comprise a heater (e.g., an infrared radiation source), when it is desired to apply photonic sintering, device 313 comprises a light source, when it is desired to apply plasma sintering, device 313 comprises a plasma source, and when it is desired to apply microwave sintering, device 313 comprises a microwave source. Also contemplated, are embodiments in which chemical sintering is employed as further detailed hereinbelow, in which case it is not necessary for block 310 to include a sintering device.

Second block 320 may include one or more print heads 322, one or more hardening, solidifying or curing devices 324 and one or more leveling devices 326. The principle and operations of dispensing heads 322 can be similar to those described above with respect to dispensing heads 112a-d.

Supply system 330 may include two or more material containers or cartridges configured to provide building materials to head 322 and patterning material(s) to head 312. In some embodiments, two or more materials from different containers included in supply system 330 may be deposited each from a different head 312 and/or 322, adjacent to each other on the tray where they may overlap but not mix.

Each of the one or more controllers 340 may include a processor 342 that may be, for example, a central processing unit processor (CPU), a chip or any suitable computing or computational device, a memory 344 and storage unit 346. For example, processor 342 may control the movement of blocks 310 and/or 320 at a desired direction. Memory 344 may include for example, a Random Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 344 may be or may include a plurality of, possibly different memory units.

The one or more memory media 344 may include an executable code, e.g., an application, a program, a process, task or script. The executable codes may include codes or instructions for controlling system 300 to fabricate 3D objects according to embodiments described herein. For example, memory 344 may include a code for creating a cross-layer pattern embedded in a plurality of modeling material layers, using for example, a first set of print heads 322, and hardening the material in the first non-conductive layer, using for example, hardening device 324. The code may further include dispensing a pattern element of a patterning material using heads 312 into a cavity formed in a previously dispensed non-conductive layer.

Storage unit 346 may store files that include design parameters of the 3D object to be fabricated by system 300. For example, 3D computer aided design (CAD) files that include the design of the 3D object may be stored in storage unit 346. The files may include the dimensions and locations of different the different layers and elements (e.g., cavities and electrical devices) that may be included in the 3D object.

System 300 may further include user interface 350. User interface 350 may be or may include input devices such as a mouse, a keyboard, a touch screen or pad or any suitable input device. It will be recognized that any suitable number of input devices may be included in user interface 350. User interface 350 may further include output devices such as: one or more displays, speakers and/or any other suitable output devices. It will be recognized that any suitable number of output devices may be included in user interface 350. Any applicable input/output (I/O) devices may be connected to controller 340. For example, a wired or wireless network interface card (NIC), a modem, printer or facsimile machine, a universal serial bus (USB) device or external hard drive may be included in user interface 350. User interface 350 may allow a user to upload instructions for controlling deposition of 3D objects according to some embodiments of the invention and/or to upload and update files comprising the design of the deposited objects (e.g., computer aided design (CAD) files) into storage unit 346.

Controller 340 may control blocks 320 and 310 and/or tray 360 to cause a relative movement between blocks 320 and 310, and tray 360 or the portion(s) of the object already deposited on the tray, such that each of heads 312 or 322 may deposit droplets of material (e.g., curable polymer or conductive ink) at a predetermined location in the X-Y plane and at a predetermined height at the Z direction.

FIGS. 3 and 4A-D are a flowchart diagram (FIG. 3) and intermediate products of an AM process (FIGS. 4A-D), according to some embodiments of the present invention.

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

During manufacturing, patterning and modeling materials are optionally and preferably deposited on a substrate. The substrate may be any substrate suitable for depositing a plurality of layers to form a 3D object. The substrate may be included in the final product. Alternatively, the substrate may not be included in the final product and may be removed after the deposition of the 3D object.

While the embodiments below are described with a particular emphasis to conductive pattern elements (made of, e.g., a conductive ink), it is to be understood that embodiments in which the pattern elements are not necessarily electrically conductive are also contemplated.

Figure 3:
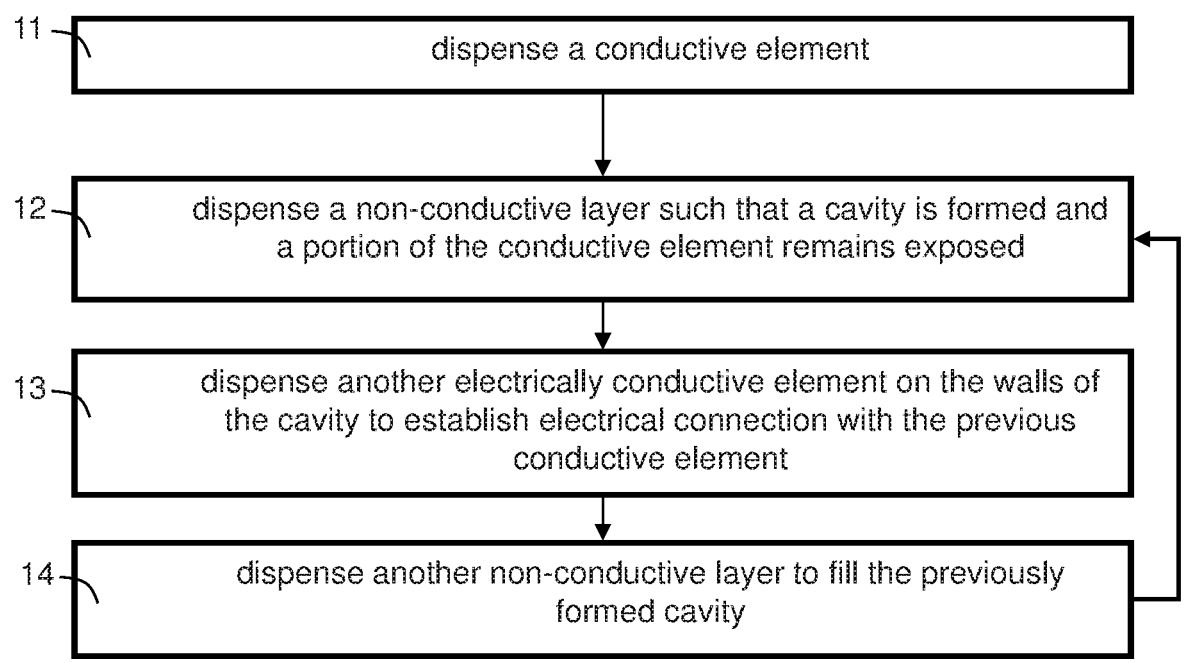
FIG. 3 is a flowchart diagram of a method suitable for fabricating a conductive pattern within a non-conductive object according to some embodiments of the invention.

Referring to FIG. 3, the method optionally and preferably includes the following operations. At 11 a conductive element is dispensed on a receiving medium. The receiving medium can be the tray of the AM system, a substrate placed on the tray, or a layer dispensed previously by one or more of the dispensing heads of the AM system. At 12 a non-conductive layer is dispensed onto the conductive element such that a cavity is formed and a portion of the conductive element remains exposed. At 13 another electrically conductive element is dispensed on the walls of the cavity to establish electrical connection with the previous conductive element, and at 14 another non-conductive layer is dispensed, preferably to fill the previously formed cavity. The method can optionally and preferably loop back to 12 to repeatedly execute operations 12, 13 and 14 until the three-dimensional object is completed. These operations will now be explained in greater detail with reference to FIGS. 4A-D.

Figure 4A:
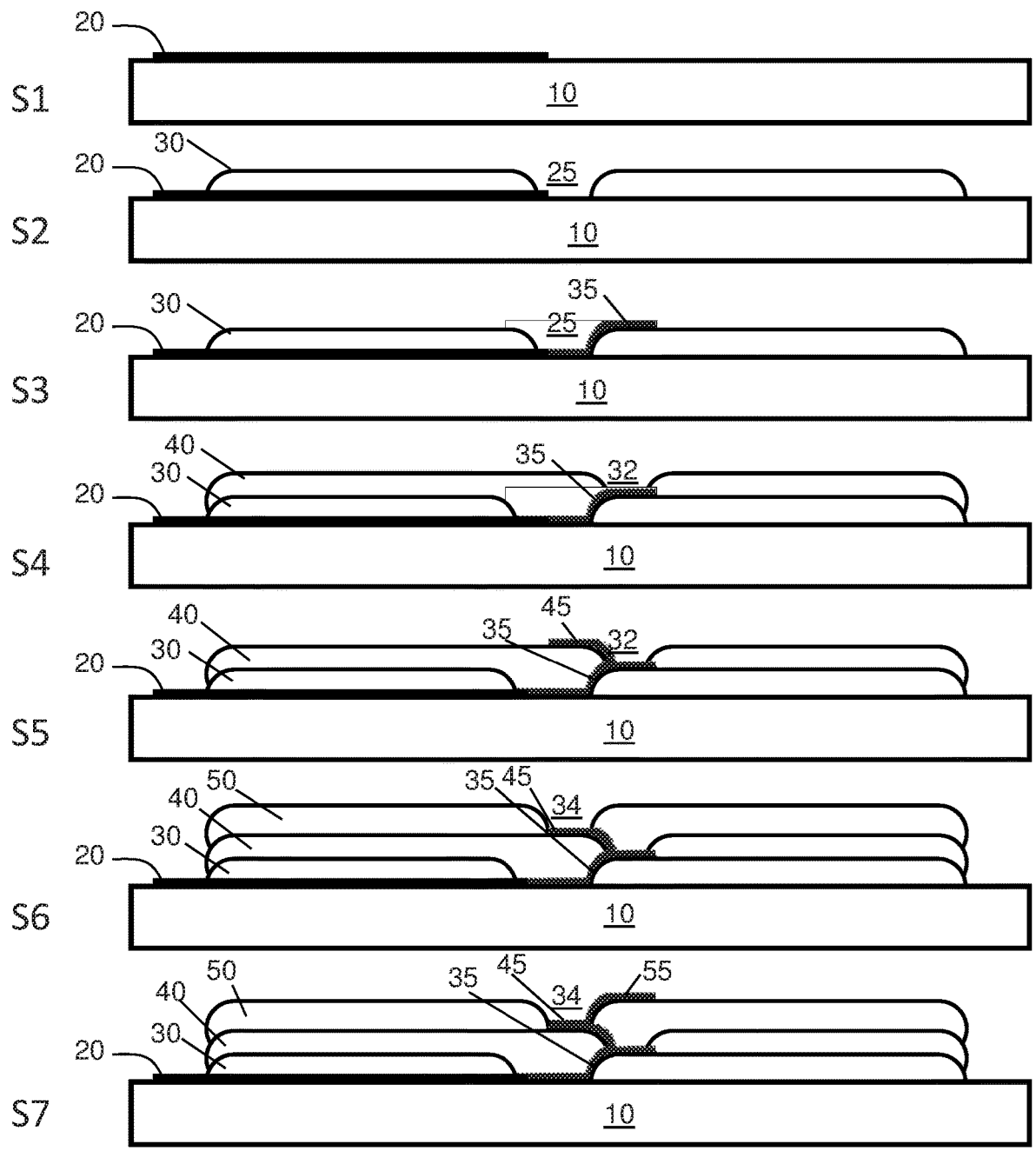
FIGS. 4A, 4B, 4C, and 4D are schematic illustrations of intermediate products of an additive manufacturing process according to embodiments of the invention.

Referring to FIG. 4A, at S1 a first electrically conductive element or layer 20 is applied onto a substrate 10. For example, element 20 may be a conductive line deposited for example from an AM system, e.g., system 110 or system 300. The thickness of element 20, namely the height of the layer along the Z direction can be from about 0.1 µm to about 3 µm. In some embodiments, element 20 may be connected, glued or placed on substrate 10 and may have a larger thickness. For example, the thickness of the layer may be larger than 5 µm; for example, the thickness of the layer may be between 5 µm-50 µm; the thickness of the layer may be between 50 µm and 100 µm, or the thickness of the layer may be larger than 100 µm.

At S2, a first layer 30 of electrically non-conductive modeling material is optionally and preferably deposited on substrate 10 and on layer 20. First layer 30 optionally and preferably includes a first cavity 25 which is not occupied by the non-conductive material, but which is above a proton of conductive element 20, such that the portion of element 20 is exposed at cavity 25. First cavity 25 may be formed by not dispensing for example one or more droplets of the electrically non-conductive material at that spot. Cavity 25 may be of any shape, such as, but not limited to, a rectangular shape, a circular shape, an elliptical shape and the like. A typical size of cavity 25 is from about 0.05 mm to about 2 mm, for example, about 0.4 mm. The walls of cavity 25 may be generally vertical, but in a preferred embodiment at least a portion of the walls is tilted relative to the horizontal direction and/or curved outwardly from cavity 25. This embodiment is preferred since it makes it easier to establish electrical conductance paths that cross layers as further detailed below.

In some embodiments of the present invention another portion of element 20, for example, in a peripheral region of the structure being built may remain uncovered to allow electrical connection of element 20 to an external device (not shown). Layer 30 is optionally and preferably hardened (e.g., cured, solidified) prior to the dispensing of any additional layer. The electrically non-conductive material of layer 30 may be any curable polymer. A typical thickness of layer 30 is from about 10 μm to about 100 μm, but other thicknesses are also contemplated.

At S3, an electrically conductive element 35 is optionally and preferably dispensed at cavity 25 optionally and preferably along the wall of cavity 25. Element 35 optionally and preferably has a linear shape (e.g., a straight or curved line, or a straight or curved strip) and is dispensed to establish connection between element 35 and previously dispensed element 20, thereby forming an electrically conductive cross-layer pattern. As illustrated in FIG. 4A, the conductive material that forms element 35 may cover at least a portion of the bottom of cavity 25, a portion of the walls of cavity 25 and an horizontal area of layer 30 at the vicinity of cavity 25.

The material that is dispensed to form conductive element 35 may be, for example, a conductive ink as further detailed hereinabove. The dispensed material is optionally and preferably dried after the dispensing to evaporate the solvent therein. The relation between thickness of element 35 along the vertical direction and the thickness of layer 30, is optionally and preferably as further detailed hereinabove with respect to the relation between the thickness of the pattern element and the thickness of the layer of building material. The thickness of element 35 along the vertical direction is optionally and preferably as further detailed hereinabove with respect to the thickness of the pattern element.

Layer 35 may be dispensed using a dispensing head of an AM system, as further detailed hereinabove.

In some embodiments, element 35 is also sintered to further consolidate the conductive particles. Sintering can be achieved using any technique known in the art, including, without limitation, thermal sintering, photonic sintering, plasma sintering, microwave sintering and chemical sintering. While radiation-based sintering is contemplated, it was unexpectedly found by the present inventors that chemical sintering is advantageous. One advantage of chemical sintering is that it does not require use of a sintering device in the dispensing block. Another advantage of chemical sintering is that it reduces the amount of unnecessary radiation to which the building material is exposed, and which can result in shape deformation of the building material layers.

Chemical sintering is optionally and preferably achieved by contacting the dispensed conductive element (element 35 in the present example, but the same technique may also be applied to any other conductive element, including any of conductive elements 45, 55, 65 and 75 described below) with a substance selected to induce sintering. The substance can optionally and preferably include a compound selected from the group consisting of free radical polymerizable compound, cationic polymerizable compound and anionic polymerizable compound. The substance can be provided as a separate composition dispensed from a separate dispensing head of the AM system. Alternatively or additionally, the substance can be provided as a sintering agent contained (e.g., mixed) in the non-conductive material.

When a sintering inducing agent is contained in the non-conductive material, the conductive material (e.g., conductive ink) is optionally and preferably dispensed on the modeling material layer before the completion of the curing of the modeling material, so as to allow the particles in the conductive material to contact the sintering inducing agent in the modeling material. Alternatively, or more preferably additionally, the non-conductive material containing the sintering inducing agent can be applied on the conductive pattern element. This can be done after the conductive material (e.g., conductive ink) is dried, after the conductive material is partially dried (e.g., after about 10%-90% solvent was evaporated from the conductive material), or immediately after the conductive material is dispensed and before drying.

Preferably, the sintering inducing agent in the non-conductive modeling material is non-curable. It was found by the present inventors that incorporation of non-curable components with a curable modeling material are advantageous since they facilitate better chemical sintering by allowing the non-curable agent to react with the conductive material (e.g., conductive ink).

The present embodiments contemplate both sintering inducing agents that are UV reactive and sintering inducing agents that are non UV reactive.

In various exemplary embodiments of the invention the sintering inducing composition or agent comprises an ionic moiety. This allows reduction of electrostatic stabilization of the conductive particles in the conductive material by charge exchange reaction. Preferably the sintering inducing composition or agent comprises an ionic group which is optionally and preferably an acrylic monomer or derivative, and a counter ion, wherein the ionic group serves as a carrier and the counter ion serves for decoupling or suppressing coupling of dispersant molecules to the conductive particles thereby allowing them to consolidate.

In various exemplary embodiments of the invention the counter ion is anionic and the ion group is cationic. The sintering inducing agents may optionally and preferably be selected amongst salts.

The counter anion may be, for example, a halogen anion ($F^-$, $Cl^-$, $Br^-$ and/or $I^-$), a sulfate anion ($SO_4^{2-}$ and/or $HSO_4^-$), a perchlorate anion ($ClO_4^-$), a chlorate anion ($ClO_3^-$), a nitrate anion ($NO_3^-$), a carboxylate anion (e.g., $RCO_2^-$, wherein R is alkyl) a p-toluenesulfonate anion or an alkanesulfonate (e.g., methanesulfonate) anion. In some embodiments of the present invention the counter anion is selected from the group consisting of chloride, sulfate, nitrate, phosphate, carboxylate (e.g., acetate) and halogen. In some embodiments, the counter anion is chloride.

The present embodiments contemplate various acrylates, methacrylates, acrylamides, methacrylamides, oligomers and polymers, which contain charged groups.

Representative examples of cationic groups suitable for the present embodiments include, without limitation, a quaternary ammonium group. For example, poly(diallyldimethylammonium chloride), cationically charged polyimides, polyethyleneimine and polypyrroles.

The salt comprising the anion is optionally a (meth) acrylate derivative having the general formula:

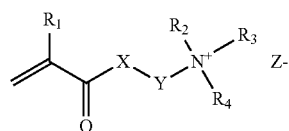

wherein:

X is O or NH;

Y is a substituted or unsubstituted hydrocarbon chain from 1 to 20 carbon atoms in length;

$R_1$ is H or $CH_3$;

$R_2$-$R_4$ are each independently an alkyl; and

Z is an anion described herein.

In some embodiments, Y is an unsubstituted hydrocarbon chain (alkylene).

In some embodiments, Y is from 1 to 10 carbon atoms in length. In some embodiments, Y is from 1 to 4 carbon atoms in length. In some embodiments, Y is 2 or 3 carbon atoms in length (e.g., —$CH_2CH_2$— or —$CH_2CH_2CH_2$—).

In some embodiments, $R_1$ is $CH_3$.

In some embodiments, $R_2$-$R_4$ are each independently methyl or ethyl. In some embodiments $R_2$-$R_4$ are each methyl.

Representative examples of specific substances that can be used as a sintering inducing agent, include, without limitation, acrylate (e.g., Adamquat MQ 80), trimethyl ammonium methyl methacrylate chloride (e.g., Visiomer TMAEMC), 3-trimethyl ammonium propyl methacrylamide chloride (e.g., Visiomer MAPTAC 30), and acrylamide (e.g., DMAPAAQ, for example, Rahn, RCX-14/705).

Free-radical polymerizable compounds may be selected among polymerizable reactive functional groups, a (meth)acrylic and meth(acryl)amide functional group.

The term "(meth)acrylic" or "(meth)acrylate" refers to both acrylates and methacrylates.

Free-radical polymerizable compounds may include (meth)acrylic or meth(acryl)amide monomers, (meth)acrylic or (meth)acrylamide oligomers, and any combination thereof.

Substances that can be used as a sintering inducing agent may include cationic polymerizable monomers, for example based on epoxide compounds, oxetane, vinyl ether and/or oligomers, the monomers bearing a cationic moiety can be, for example, quarternary ammonium salt. A non-limiting example of epoxy compounds includes glycidyl trimethyl-ammonium chloride.

Substances that can be used as a sintering inducing agent may alternatively or additionally include areisocyanate compounds, optionally and preferably with quaternary ammonium groups for polyurethane chemistry, and/or caprolactam based compounds, optionally and preferably with quaternary ammonium groups for anionic polymerization.

When the sintering inducing agent is non UV reactive, in may be selected from the group consisting of a salt, such as, but not limited to, KCl, NaCl, $MgCl_2$, $AlCl_3$, LiCl, $CaCl_2$, organic or inorganic acids, e.g., HCl, $H_2SO_4$, $HNO_3$, $H_3PO_4$, and organic or inorganic bases, e.g., ammonia, organic amines (e.g., aminomethyl propanol (AMP)), NaOH and KOH.

In some embodiments, the sintering is at a room temperature (e.g., about 25° C.), and in some embodiments of the present invention the sintering is at the operation temperature of the AM system, e.g., from about 40° C. to about 50° C. Higher temperatures are also contemplated.

Referring again to FIG. 4A, at S4 a second non-conductive layer 40 is optionally and preferably dispensed, for example, to at least partially cover previously formed non-conductive layer 30 and cavity 25. In various exemplary embodiments of the invention layer 40 is dispensed to form a second cavity 32 above a portion of element 35 so that the portion of element 35 is exposed at second cavity 32. Layer 40 optionally and preferably fills cavity 25 with the non-conductive material. Layer 40 may be made of the same or different material as layer 30. Layer 40 is optionally and preferably hardened (e.g., cured, solidified) prior to the dispensing of any additional material.

Figure 4B:
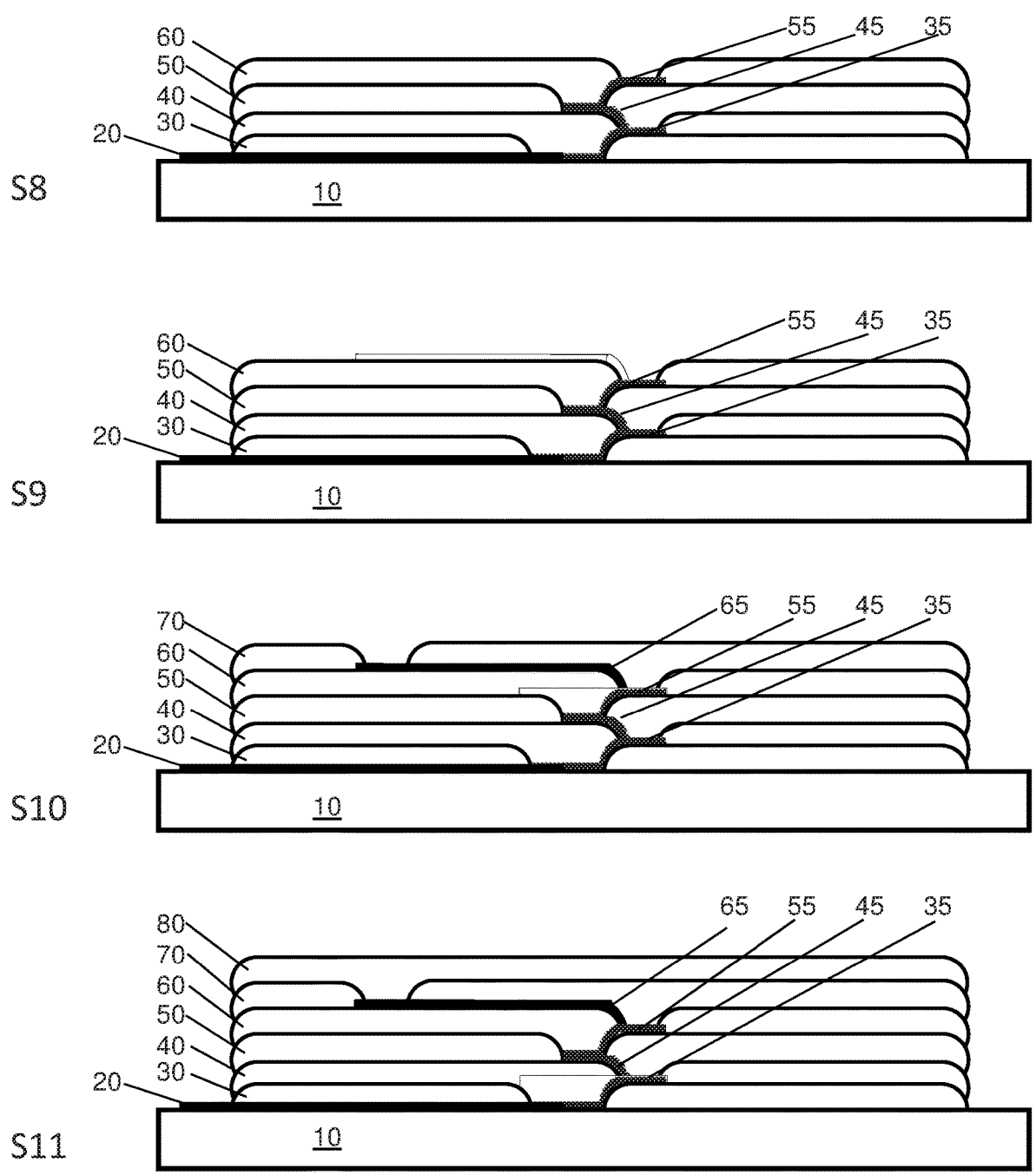

The above described process can be repeated any number of times. For example, as shown at S5-S7, an additional electrically conductive element 45 can be dispensed at cavity 32 (see S5), a non-conductive layer 50 can be dispensed to fill previously formed cavity 32 and to form another cavity 34 above element 45 (see S6), and an additional electrically conductive element 55 can be dispensed at cavity 34. Additional dispensing stages S8-S11 of non-conductive layers 60, 70 and 80, and conductive element 65 are illustrated in FIG. 4B, and will be readily understood to one of ordinary skill provided with the above description of FIG. 4A.

Figure 4C:
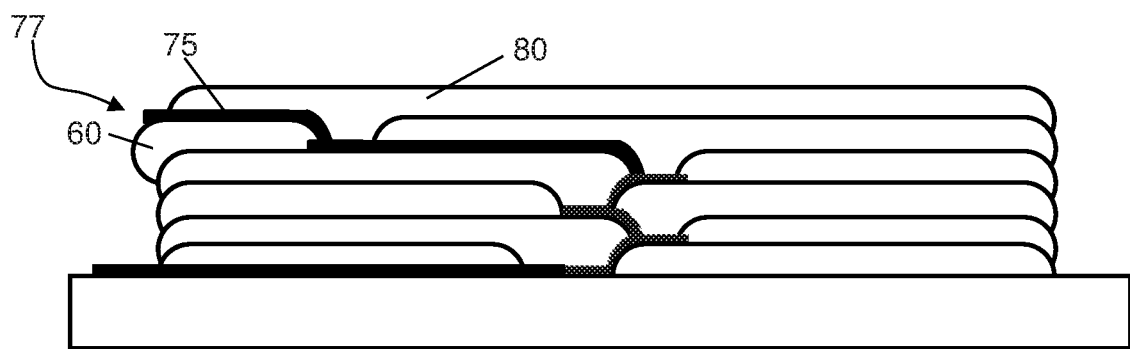
Figure 4D:
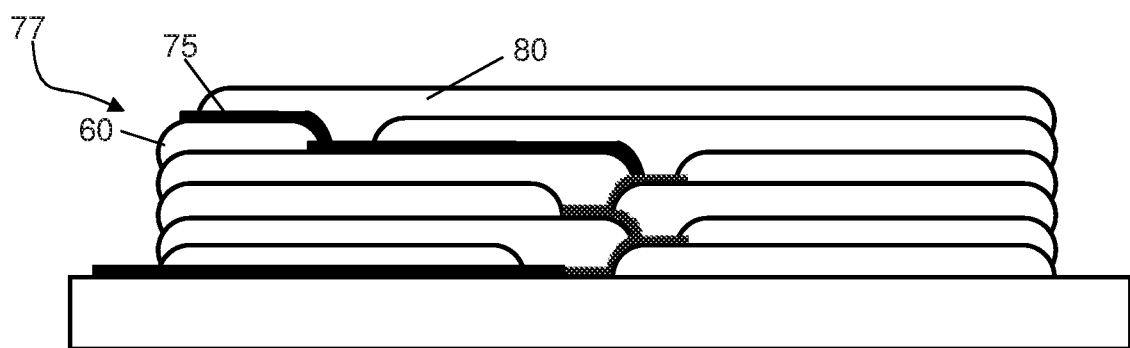

In the final object, one or more, preferably at least two, of the electrically conductive elements may be left exposed along at least a portion thereof. These embodiments are particularly useful to allow connecting the exposed element to external electronic or electrical devices. Preferably, these element(s) are exposed at in the periphery of the object. These embodiments are illustrated in FIG. 4C. As shown, a non-conductive layer 80 is dispensed over a conductive element material 75 such that the end 77 of element 75 is uncovered by layer 80 and remains exposed to the environment. In the representative illustration shown in FIG. 4C, non-conductive layer 60 carrying conductive element 75 is dispensed to protrude outwardly and horizontally from the final object and element 75 is dispensed in a manner that it also protrudes outwardly and horizontally from the final object. However, this need not necessarily be the case since in some embodiments it may be desired to make conductive element 75 without such protrusion. A representative example is illustrated in FIG. 4D in which layer 80 intents inwardly, thereby leaving end 77 of element 75 exposed.

The final 3D object optionally and preferably includes a plurality of layers of non-conductive material (e.g., layers 30, 40, 50, 60, 70, 80) and a plurality of conductive elements (e.g., layers 35, 45, 55, 65, 75) embedded in the layers of non-conductive material inside the 3D object, to form a conductive pattern within the object. The two conductive ends of the pattern can further be connected to any electronic or electric device or other conductive lines or elements.

Figure 4E:
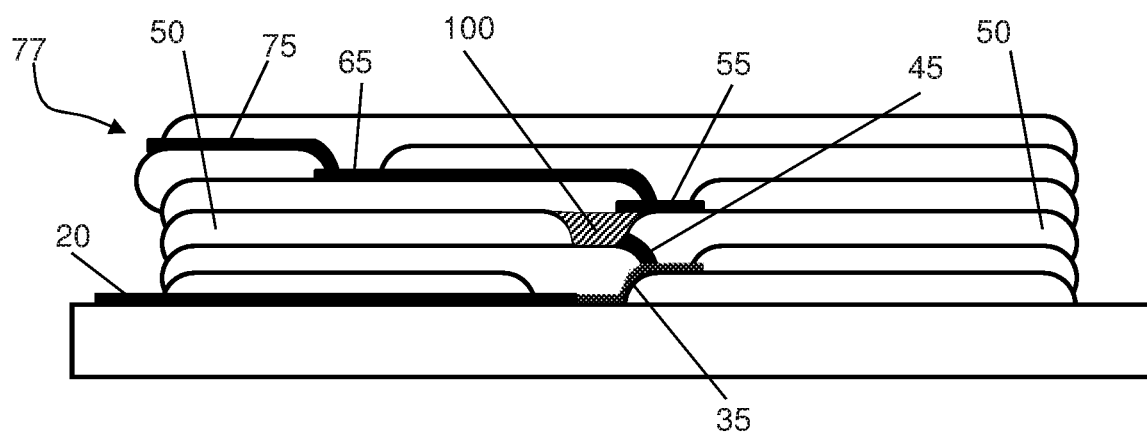
FIG. 4E is a schematic illustration of a 3D object that includes an electronic device embedded therein, according to some embodiments of the present invention.

Reference is made to FIG. 4E that schematically illustrate a 3D object that includes an electronic device 100 embedded therein. Electronic device 100 may be placed onto a previously formed non-conductive layer or a previously formed conductive element. Device 100 is optionally and preferably buried in an object fabricated by AM (e.g., by 3D printing) such that at least one non-conductive layer is above device 100 and at least one non-conductive layer is below device 100.

Electronic device 100 may be of any type, including, without limitation, a microchip, a battery, a PCB, a light emitting device (e.g., a light emitting diode or a lamp), a radiofrequency identification (RFID) tag, a transistor, and the like. Electrical communication with external electronic or electrical devices can be established by means of the electrically conductive elements disposed according to embodiments of the present invention. In the representative illustration shown in FIG. 4E, which is not to be considered as limiting, device 100 is placed in a cavity formed in one or more non-conductive layers (layer 50 in the present example). One electrically conductive pattern in electrical communication with device 100 is formed by conductive elements below layer 50 (elements 20, 35 and 45 in the present example), and another conductive pattern in electrical communication with device 100 is formed by conductive elements above layer 50 (elements 55, 57 and 58 in the present example). Device 100 can be utilized by connecting elements 58 and 20 to an external electrical or electronic device (not shown). As a representative example, when device 100 is a voltage-driven appliance (e.g., a light emitting device) a voltage can be applied between elements 58 and 20 to activate device 100.

While FIG. 4E illustrates a certain configuration in which device 100 is connected to one pattern generally below device 100 and another pattern generally above device 100, other configurations are also contemplated. For example, in some embodiments device 100 can be connected to two patterns that are below device 100, and in some embodiments device 100 can be connected to two patterns that are above device 100. Also contemplated are embodiments in which device 100 is connected to more than two patterns. These embodiments are particularly useful when device 100 has three or more terminals. A representative example is a transistor in which case one pattern is used to connect device 100 to a source electrode, one pattern is used to connect device 100 to a drain electrode, and one pattern is used to connect device 100 to a gate electrode. Another example is a multi-terminal microchip in which three or more terminals of the microchip are connected to different terminals of the microchip.

The procedure for forming an object such as the object shown in FIG. 4E can be similar to the procedure described above with respect to FIG. 4A, except that the AM process is temporarily ceased after one or more layers of non-conductive materials and optionally conductive elements are deposited. In a preferred embodiment, a cavity or a niche sizewise and shapewise compatible with the electronic device is formed in the object before the cessation. During the temporary cessation, the electronic device is placed onto a non-conductive layer and/or conductive element (for example, in the pre-prepared niche). Thereafter, the AM process is resumed, as further detailed hereinabove.

In any of the embodiments described herein, the dispensed layers of the non-conductive material are optionally and preferably leveled to reduce an excess material that may be dispensed and to sustain the thickness of the layers at a desired thickness. Such leveling may be performed by a leveling device 326 (e.g., a roller), prior to the hardening process. Leveling device 326 can reduce excess material in a layer by lifting such excess material away from the layer, as opposed to spreading or pressing the material, for example so as not to cover the formed cavity with excess material.

It was found by the present inventor that due to the relatively small thickness of the conductive elements dispensed on top of the non-conductive layers they may be potentially damaged by the leveling operation. Such damage is undesired since it may reduce the conductivity of the conductive pattern. The present embodiment provides a solution to this problem by forming a cavity having a step-like structure and then dispensing the conductive layer, as will now be explained with reference to FIGS. 5 and 6.

Figure 5:
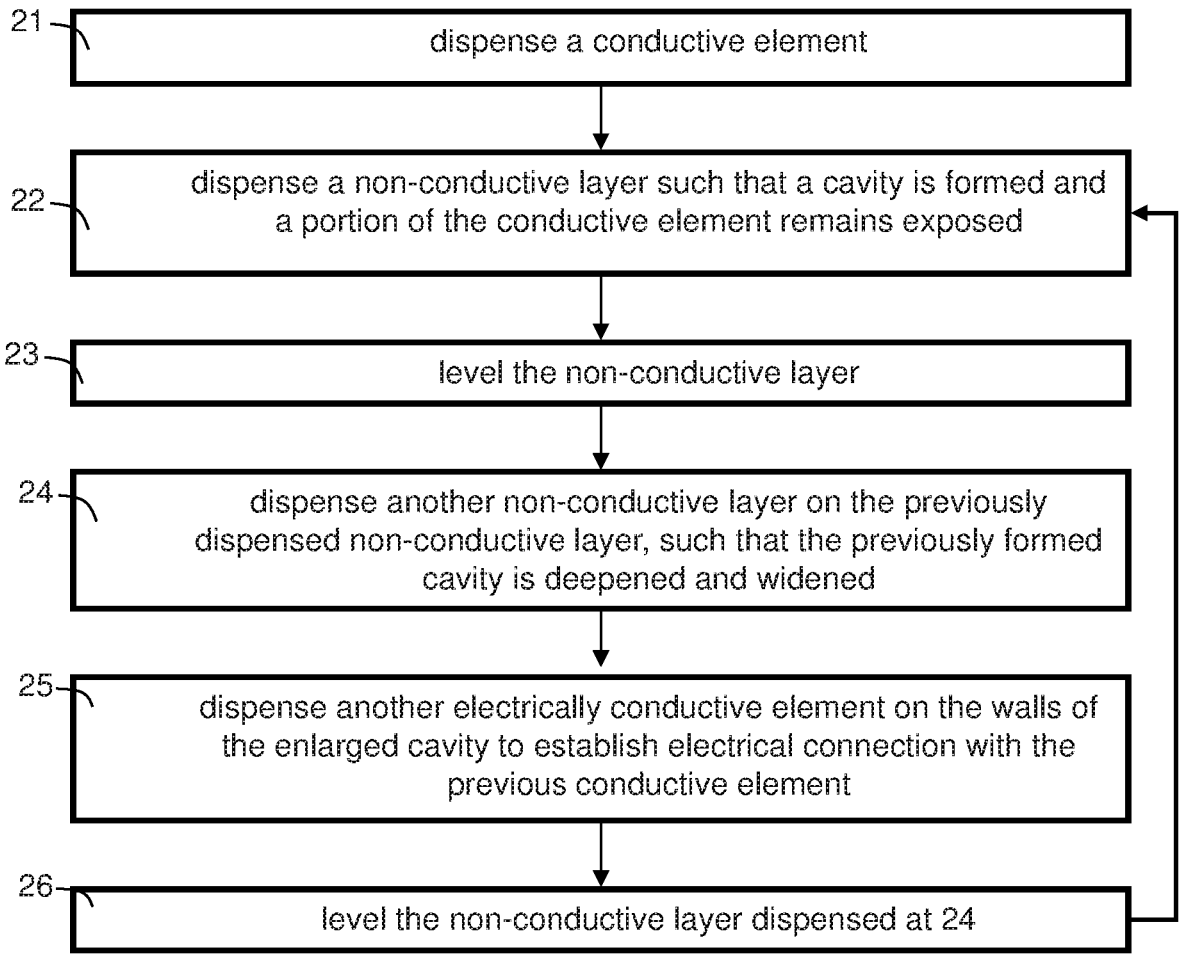
FIG. 5 is a flowchart diagram of a method suitable for fabricating a conductive pattern by forming stepped cavity according to some embodiments of the invention.
Figure 6:
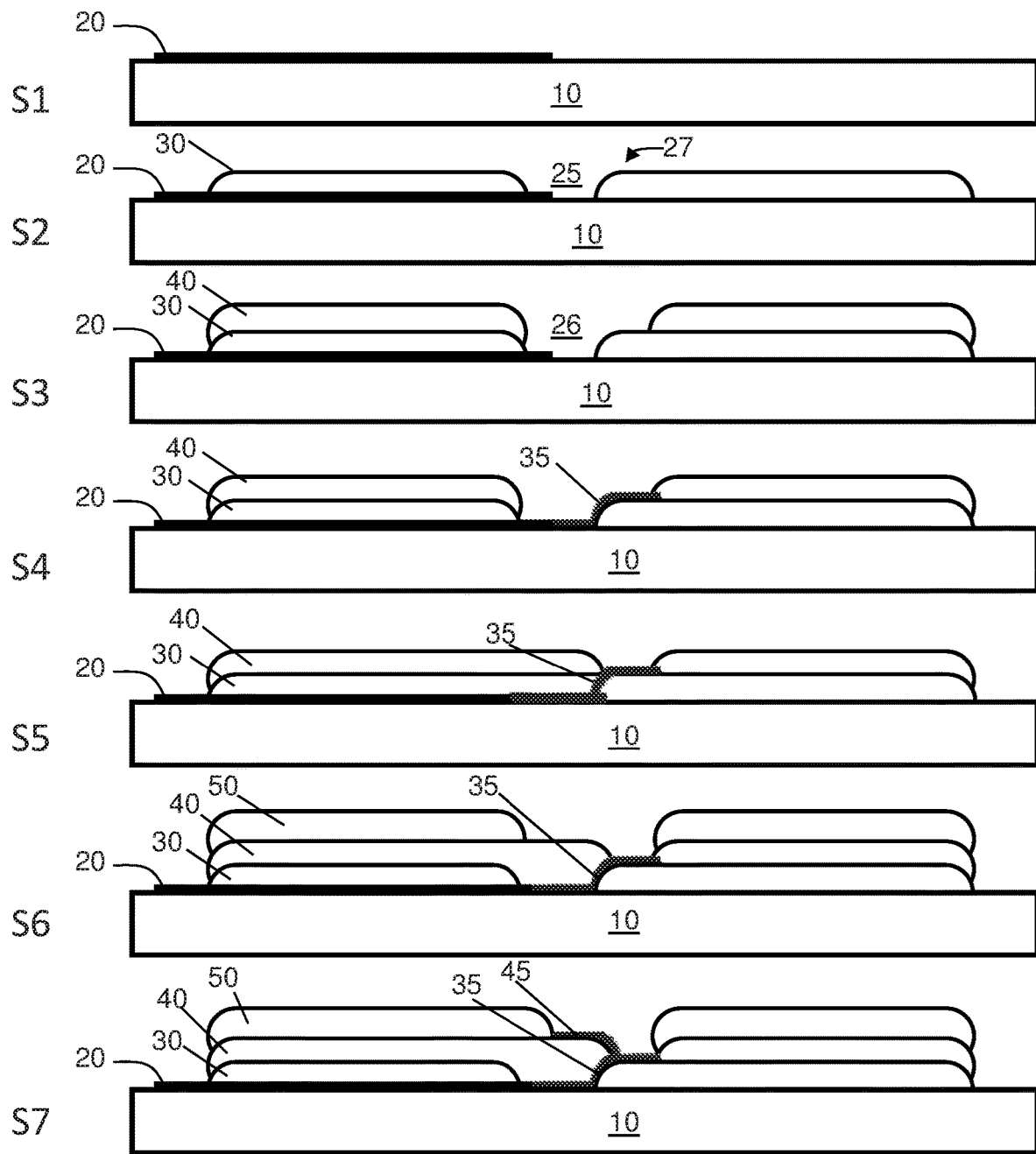
FIG. 6 are schematic illustrations of intermediate products of an additive manufacturing process in which stepped cavities are formed according to some embodiments of the present invention.

FIGS. 5 and 6 are a flowchart diagram (FIG. 5) and intermediate products of an AM process (FIG. 6), according to some embodiments of the present invention.

Referring to FIG. 5, the method optionally and preferably includes the following operations. At 21 a conductive element is dispensed on the substrate. At 22 a non-conductive layer is dispensed onto the conductive element such that a cavity is formed and a portion of the conductive element remains exposed. At 23 the non-conductive layer is leveled. At 24 another non-conductive layer is dispensed on the previously dispensed non-conductive layer, such that the previously formed cavity is deepened and widened. At 25 another electrically conductive element is dispensed on the walls of the enlarged cavity to establish electrical connection with the previous conductive element, and at 26 the non-conductive layer dispensed at 24 is leveled. These operations will now be explained in greater detail with reference to FIG. 6.

As illustrated in FIG. 6, conductive element 20 is dispensed on substrate 10 (see S1) as further detailed hereinabove. At S2, non-conductive layer 30 is optionally and preferably dispensed on top of element 20 and substrate 10. Layer 30 preferably includes a cavity 25 as further detailed hereinabove. Layer 30 is optionally and preferably leveled, and then hardened, as further detailed hereinabove. At S3, another layer 40 of non-conductive material is optionally and preferably dispensed on top of the layer 30. The dispensing of layer 40 is preferably such that no non-conductive material is dispensed into cavity 25 and optionally also at least at the periphery 27 of cavity 25 (see S2) thus forming a larger cavity 26, the walls of which defined by both layers 30 and 40, and the base of which is defined by element 20 and/or substrate 10. Cavity 26 has a cross section that is larger than the cross section of cavity 25. Cavity 26 optionally and preferably has a stepped inner structure formed by the offset of layer 40 relative to layer 30. The stepped structure may be asymmetrical (as illustrated) or symmetrical, as desired.

At S4, electrically conductive element 35 is optionally and preferably dispensed at cavity 26, such that the conductive material covers at least a portion of the bottom and a portion of the walls of cavity 26. Preferably, element 35 is dispensed on the part of the wall of cavity 26 that is formed by layer 30 but not on the part of the wall of cavity 26 that is formed by layer 40. Thus, element 35 is optionally and preferably below the upper surface of most recently dispensed layer 40.

Following the dispensing of element 35, additional non-conductive materials may be dispensed (see S5) to extend layer 40 further into cavity 26. The additional dispensing is preferably such that a portion of element 35 remains exposed. After completion of the additional dispensing, non-conductive layer 40 may be leveled. Since the element 35 is below the level of the top surface of layer 40, the leveling process does not damage the electrically conductive material in element 35.

The process can be repeated as schematically illustrated at S7 and S6. Specifically, at S6 non-conductive layer 50 is dispensed over layer 40, such that no non-conductive material is dispensed above the area around cavity 26 and above the portion of element 35 that is not covered by layer 40. This forms another stepped cavity, the walls of which being defined by layers 40 and 50 and the base of which being defined by element 35 and/or layer 30. At S7, conductive element 45 is dispensed onto at least a portion of the bottom and a portion of the walls of the additional cavity, but preferably not on layer 50 so as to maintain element 45 below the top surface of layer 50. The dispensing sequence may continue by dispensing an additional non-conductive material to extend layer 50 into the stepped cavity as further detailed hereinabove. Layer 50 can then be safely leveled without damaging element 45 as further detailed hereinabove.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of fabricating a cross-layer pattern in a layered object, the method being executed by an additive manufacturing (AM) system and comprising:
   dispensing by said AM system a patterning material onto a receiving medium to form a first pattern element;
   by said AM system, dispensing onto said first pattern element layers of modeling material that are laterally offset with respect to each other to form in said layers of said modeling material a first open cavity exposing at least a portion of said first pattern element beneath said layers, said first open cavity being a stepped cavity defined by said offset and having a non-vertical wall made of said modeling material; and
   dispensing by said AM system a patterning material onto said exposed portion of said first pattern element and said non-vertical wall of said stepped cavity leaving other parts of said stepped cavity empty to form a second pattern element contacting said first pattern element, thereby forming a cross-layer pattern of said patterning material.

2. The method of claim 1, wherein said non vertical wall is planar.

3. The method of claim 1, wherein said non vertical wall is curved.

4. The method according to claim 1, further comprising dispensing additional layers of modeling material onto a topmost layer of said first cavity and also into said first cavity.

5. The method according to claim 4, wherein said dispensing said modeling material into said first cavity comprises leaving at least a portion of said second pattern element exposed beneath said dispensed modeling material.

6. The method according to claim 5, wherein said dispensing said modeling material onto said topmost layer of said first cavity comprises forming a second open cavity exposing said portion of said second pattern element beneath said dispensed modeling material.

7. The method according to claim 6, wherein said dispensing said additional layers comprises filling said first cavity by modeling material.

8. The method according to claim 6, wherein said second cavity is laterally displaced relative to said first cavity.

9. The method according to claim 4, wherein said dispensing said modeling material onto said first pattern element and said dispensing said modeling material onto said topmost layer of said first cavity are by different dispensing heads of said AM system, each head dispensing a different modeling material.

10. The method according to claim 1, further comprising alternately repeating said dispensing of said patterning material and said modeling material a plurality of times, to form a plurality of layers of modeling material, and a plurality of pattern elements interconnected to form a continuous pattern crossing said plurality of layers.

11. The method according to claim 1, wherein said patterning material is conductive.

12. The method according to claim 1, wherein a thickness of each of said pattern element is at least two times less than a thickness of each of said layers of modeling material.

13. The method according to claim 1, further comprising placing an electronic or electric device in said cavity, wherein said pattern element is conductive and wherein said pattern element contacts an electric terminal of said device.

14. The method according to claim 1, further comprising sintering said pattern element.

15. The method according to claim 1, wherein said modeling material comprises a sintering inducing agent, and wherein said dispensing of said modeling material and/or said patterning material is executed such that said sintering inducing agent reacts with said patterning material to sinter said patterning element.

16. The method according to claim 15, wherein said sintering inducing agent comprises a compound selected from the group consisting of free radical polymerizable compound, cationic polymerizable compound and anionic polymerizable compound.

17. The method according to claim 15, wherein said sintering inducing agent comprises an ionic group and a counter ion, said ionic group being an acrylic monomer or derivative.

18. The method according to claim 16, wherein said sintering inducing agent comprises an ionic group and a counter ion, said ionic group being an acrylic monomer or derivative.

19. The method according to claim 18, wherein said sintering inducing agent is a salt.

20. The method according to claim 18, wherein said counter ion is anionic and the ion group is cationic.

21. The method according to claim 18, wherein said ionic group selected from the group consisting of an acrylate, a methacrylate, an acrylamide, a methacrylamide, an oligomer and a polymer.

22. The method according to claim 19, wherein said sintering inducing agent is a (meth)acrylate derivative having the general formula:

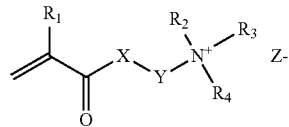

wherein:
X is O or NH;
Y is a substituted or unsubstituted hydrocarbon chain from 1 to 20 carbon atoms in length;
$R_1$ is H or $CH_3$;
$R_2$-$R_4$ are each independently an alkyl; and
Z is an anion.

23. The method according to claim 15, wherein said sintering inducing agent is selected from the group consisting of acrylate, trimethyl ammonium methyl methacrylate chloride, 3-trimethyl ammonium propyl methacrylamide chloride, acrylamide.

24. The method according to claim 1, wherein said first pattern element and said second pattern element are made of the same material.

* * * * *